(12) United States Patent
Tomohiro

(10) Patent No.: US 6,351,418 B1
(45) Date of Patent: Feb. 26, 2002

(54) MEMORY DEVICE CAPABLE OF PREVENTING FROM ILLEGALLY READ OUT MEMORY CONTENTS

(75) Inventor: Ichiro Tomohiro, Shijounawate (JP)

(73) Assignee: Sharp Kabushiki Kaisha, Osaka (JP)

( * ) Notice: Subject to any disclaimer, the term of this patent is extended or adjusted under 35 U.S.C. 154(b) by 0 days.

(21) Appl. No.: 09/695,051

(22) Filed: Oct. 25, 2000

(30) Foreign Application Priority Data

Feb. 14, 2000 (JP) .......................................... 12/034975

(51) Int. Cl.[7] .............................................. G11C 16/04
(52) U.S. Cl. ............................ 365/189.03; 365/189.07; 365/185.04; 365/194
(58) Field of Search ..................... 365/189.03, 189.07, 365/185.04, 194

(56) References Cited

U.S. PATENT DOCUMENTS

| | | | | |
|---|---|---|---|---|
| 4,821,240 A | * | 4/1989 | Nakamura et al. | 365/228 |
| 4,864,542 A | * | 9/1989 | Oshima et al. | 365/189.01 |
| 5,377,343 A | * | 12/1994 | Yaezawa | 395/425 |
| 5,396,471 A | | 3/1995 | Kitsu | 365/230.01 |
| 5,406,519 A | * | 4/1995 | Ha | 365/195 |
| 5,559,992 A | * | 9/1996 | Stutz et al. | 395/490 |
| 5,838,613 A | * | 11/1998 | Takizawa | 365/185.04 |

FOREIGN PATENT DOCUMENTS

| | | |
|---|---|---|
| EP | 0707317 | 4/1996 |
| JP | 4284556 | 10/1992 |
| JP | 6282495 | 3/1994 |
| JP | 8115265 | 5/1996 |
| JP | 11175334 | 2/1999 |

* cited by examiner

*Primary Examiner*—Richard Elms
*Assistant Examiner*—Tuan T. Nguyen

(57) ABSTRACT

A coincidence circuit outputs a coincidence signal when a specific address derived from a specific address setting circuit and an input address coincided with each other. A counter circuit outputs a pulse signal each time the coincidence signal is inputted to a specified number of times. According to the pulse signal, a multiplexer switching circuit toggles the output of the multiplexer to the false data side connecting to a false data conversion circuit over a specified range of addresses. Thus, when addresses of the memory cell array are scanned in an unauthorized user's attempt at an illegal read, the false data is mixed into the read data at a specified period, making it difficult to reproduce correct data or correct programs from the acquired data. Consequently, with this memory device, it is impossible to reproduce correct data or correct programs even if an attempt to illegally read memory contents is made.

16 Claims, 3 Drawing Sheets

MEMORY DEVICE CAPABLE OF PREVENTING FROM ILLEGALLY READ OUT MEMORY CONTENTS

BACKGROUND OF THE INVENTION

The present invention relates to memory devices and, more particularly, to a memory device having a data protection circuit for protecting contents stored in memory from illegal reads such as fraudulent copy.

For example, some semiconductor memories such as ROM (Read Only Memory) and flash EEPROM (batch-erase type Electrically Erasable, Programmable Read Only Memory) are equipped with a built-in data protection circuit to protect programs and data stored therein from illegal reads such as fraudulent copy.

In data protection circuits that have conventionally been practically used or proposed, as disclosed in Japanese Patent Laid-Open Publications HEI 6-282495, HEI 4-284556, HEI 8-115265 and HEI 11-175334, when a specific address is designated upon scanning of addresses of a semiconductor memory, data read from a specified range of addresses following the specific address are converted into false data having an arbitrary regularity (inversion, bit exchange or the like) and outputted as such.

FIG. 3 shows a semiconductor memory device internally equipped with a conventional data protection circuit. This semiconductor memory device is a circuit using, for example, an electrically erasable flash EEPROM. Referring to FIG. 3, an address decoder 1 decodes an input address coming from external to select word lines and bit lines of a memory cell array 2, which is an array of flash EEPROM cells. Then, data is read from memory cells associated with the selected word lines and bit lines by the memory cell array 2, and outputted to one input terminal of a multiplexer (MUX) 4 and a false data conversion circuit 3. After this, the false data conversion circuit 3 converts the read data into the false data, and outputs the false data to the other input terminal of the multiplexer 4.

On the other hand, a coincidence circuit 5 compares a specific address set and outputted by a specific address setting circuit 6 with the input address, where if these two addresses are coincident with each other, the coincidence circuit 5 outputs a coincidence signal, which is a pulse signal of a specified time duration. Then, a multiplexer switching circuit 7, upon receiving the coincidence signal from the coincidence circuit 5, toggles the output of the multiplexer 4 to the false data side for a specified time.

As a result of this, each time the input address becomes the specific address, the multiplexer 4 selects the false data derived from the false data conversion circuit 3 for the specified time, and transmits the data to an output buffer circuit 8. Otherwise, the multiplexer 4 selects data read from the memory cell array 2, and transmits the data to the output buffer circuit 8. Then, the data transmitted from the multiplexer 4 is outputted to external by the output buffer circuit 8.

In this case, when addresses of the memory cell array 2 are scanned in an unauthorized user's attempt at an illegal read, the output of the multiplexer 4 is toggled to the false data side for the specified time based on the coincidence signal derived from the coincidence circuit 5 each time the specific address is inputted. As a result, each time the specific address is inputted, false data corresponding to a specified range of addresses is outputted.

In contrast to this, an authorized user is allowed to make such a setting, in preparing programs to be stored into the memory cell array 2, that data is not read from the specific address. Also, since the authorized user knows the specific address and the method for converting false data, the authorized user can restore correct data even if false data corresponding to the specified range of addresses following the specific address is read. However, without enough care to the false data conversion method in the false data conversion circuit 3, there is a possibility that the specific address may be found out when the false data contains some data which is out of common use. As the false data conversion method, the following methods have been proposed:

(1) Read data is modified by the address signal itself, thereby converted into false data, and outputted; (2) Read data is converted into false data having an arbitrary regularity and outputted; (3) Read data is inverted, thereby converted into false data, and outputted; and (4) Read data as well as output data of a random data generating circuit are arithmetically processed by an arithmetic circuit, thereby converted into false data, and outputted.

However, the semiconductor memory device internally equipped with this conventional data protection circuit has the following problems. That is, in this conventional data protection circuit, it is relatively easy to determine the specific address at which false data begins to be outputted, and moreover all the output data corresponding to a specified range of addresses following the specific address is false data. Therefore, if the specific address is determined, there is a possibility that original read data corresponding to the specified range of addresses following the specific address may be analyzed out.

SUMMARY OF THE INVENTION

Accordingly, an object of the present invention is to provide a memory device which makes it impossible to reproduce correct data or correct program codes even in an attempt to illegally read out memory contents.

In order to achieve the above object, there is provided a memory device characterized by detecting that an access address to a memory cell array has coincided with a preset specific address, counting a number of times of the coincidence between the access address and the specific address, and outputting data other than data read from the access address in the memory cell array at a specified period based on the counted value.

With this constitution, when addresses of the memory cell array are scanned in an unauthorized user's attempt at an illegal read, data other than data read from the accessed addresses in the memory cell array is outputted at a specified cycle period based on the number of times the accessed address has coincided with the specific address. Therefore, the unauthorized user is inhibited from reproducing correct data or correct program codes from acquired data. Accordingly, the unauthorized user is also inhibited from correctly emulating a memory device capable of outputting the correct data or correct program codes.

Even if the specific address should be found out from acquired data, it would be impossible to determine which is correct read data, because output data over a specified range of addresses following the specific address is in some cases correct read data and in other cases data other than the read data.

In one embodiment of the present invention, the memory device further comprises: a memory cell array; a data conversion circuit for converting read data read from the memory cell array into other data and outputting the converted data; a multiplexer for receiving, as its inputs, the read data and the converted data of the read data, and outputting either one of those data; a coincidence-number counter for counting a number of times the preset specific address and the input address have coincided with each other, and outputting a pulse signal each time a counted value becomes a specified value; and a multiplexer switching circuit for toggling the output of the multiplexer to the converted data side each time the pulse signal is inputted.

With this constitution, when addresses of the memory cell array are scanned in an unauthorized user's attempt at an illegal read, converted data other than data read from an input address in the memory cell array is outputted over a range corresponding to a pulse duration of the pulse signal from the coincidence-number counter at a specified cycle period that depends on the number of times the input address has coincided with the specific address. Therefore, the unauthorized user is inhibited from reproducing correct data or correct program codes from acquired data. Even if the specific address should be found out from acquired data, it would be impossible to determine which data is correct read data, because the output data corresponding to a specified range of addresses following the specific address is in some cases correct data and in other cases false data.

In one embodiment of the present invention, the memory device further comprises: a memory cell array; an address conversion circuit for converting an input address into another address; a multiplexer for receiving, as its inputs, the input address and the converted address of the input address, and outputting either one of those addresses; an address decoder for decoding the address from the multiplexer to select memory cells of the memory cell array; a coincidence-number counter for counting a number of times the preset specific address and the input address have coincided with each other, and outputting a pulse signal each time a counted value becomes a specified value; and a multiplexer switching circuit for toggling the output of the multiplexer to the converted data side each time the pulse signal is inputted.

With this constitution, when addresses of the memory cell array are scanned in an unauthorized user's attempt at an illegal read, read data from a converted address other than an input address in the memory cell array is outputted over a range corresponding to a pulse duration of the pulse signal derived from the coincidence-number counter at a specified cycle period that depends on the number of times the input address has coincided with the specific address. Therefore, it is impossible to reproduce correct data or correct program codes from acquired data. Even if the specific address should be found out from the acquired data, it would be impossible which is correct read data, because the output data corresponding to the specified range of addresses following the specific address is in some cases correct data and in other cases false data.

In one embodiment of the present invention, first program codes executable by an external arithmetic unit are stored in the memory cell array, and the data, other than the read data, to be outputted at the specified period are second program codes executable by the arithmetic unit.

With this constitution, first program codes read from the accessed addresses of the memory cell array are transmitted to the external arithmetic unit until the accessed address reaches the specific address. Then, when the accessed address has reached the specific address, second program codes other than the read codes from the access address are transmitted to the arithmetic unit over a specified range of addresses. Therefore, it becomes possible that the arithmetic unit normally executes the first program codes and that, each time the access address has reached the specific address, the arithmetic unit executes the second program codes.

In one embodiment of the present invention, the memory cell array is a semiconductor memory cell array, which is implemented by any one of nonvolatile memory, read only memory or batch-erase type electrically erasable, programmable read only memory.

With this constitution, data stored in the memory array cell of the semiconductor memory such as nonvolatile memory, ROM or flash EEPROM is prevented from illegally read by any unauthorized user, and from being used to emulate the semiconductor memory device.

BRIEF DESCRIPTION OF THE DRAWINGS

The present invention will become more fully understood from the detailed description given hereinbelow and the accompanying drawings which are given by way of illustration only, and thus are not limitative of the present invention, and wherein.

DETAILED DESCRIPTION OF THE PREFERRED EMBODIMENTS

Hereinbelow, the present invention is described in detail by way of embodiments thereof illustrated in the accompanying drawings.

First Embodiment

Figure 1:
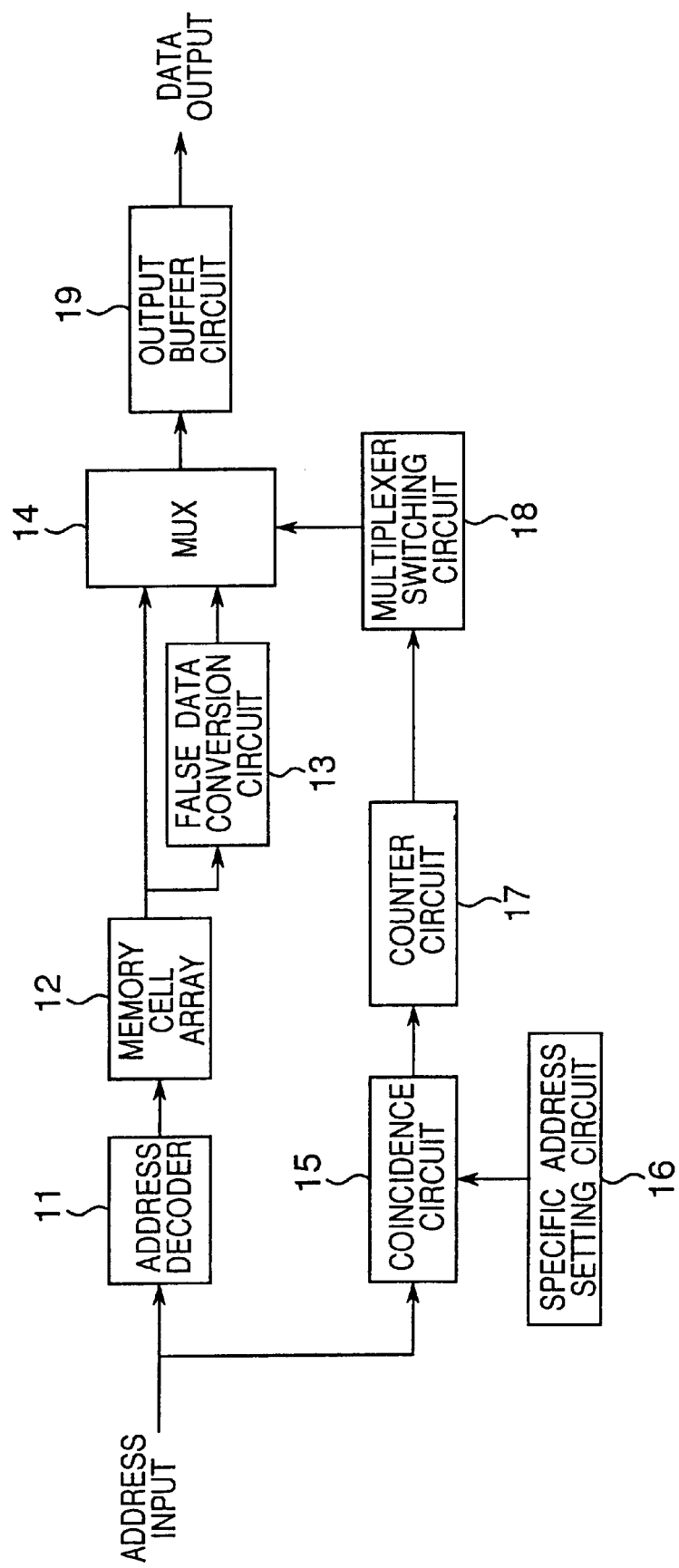
FIG. 1 is a block diagram of a semiconductor memory device as a memory device of the present invention.

FIG. 1 is a block diagram of a semiconductor memory device as a memory device of this embodiment. This semiconductor memory device is a flash EEPROM circuit and generally made up of an address decoder 11, a memory cell array 12, a false data conversion circuit 13, a multiplexer (MUX) 14, a coincidence circuit 15, a specific address setting circuit 16, a counter circuit 17, a multiplexer switching circuit 18 and an output buffer circuit 19.

Figure 3:
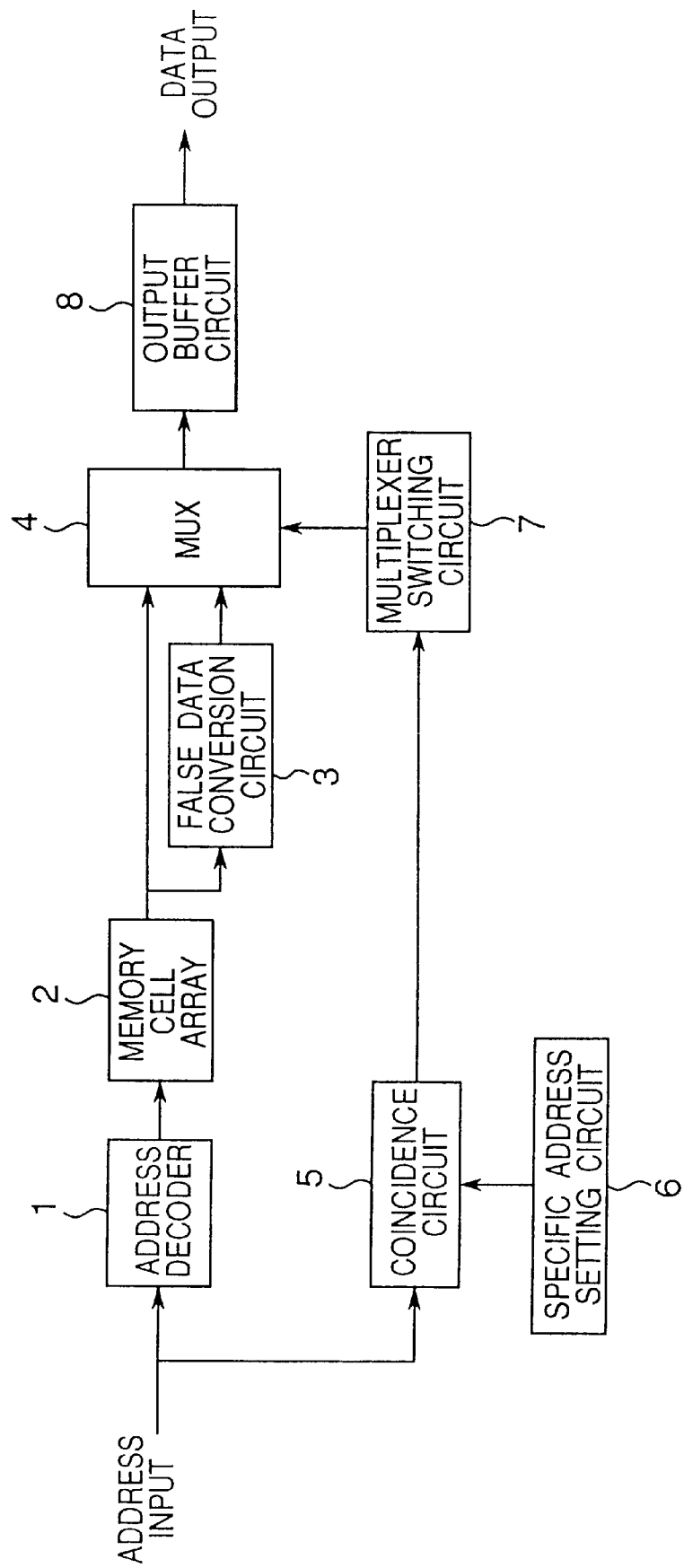
FIG. 3 is a block diagram of a semiconductor memory device equipped with a built-in data protection circuit according to the conventional art.

The address decoder 11, the memory cell array 12, the false data conversion circuit 13, the multiplexer (MUX) 14, the coincidence circuit 15, the specific address setting circuit 16 and the output buffer circuit 19 operate in the same manner as the address decoder 1, the memory cell array 2, the false data conversion circuit 3, the multiplexer 4, the coincidence circuit 5, the specific address setting circuit 6 and the output buffer circuit 8, respectively, in the conventional semiconductor memory device as shown in FIG. 3.

The semiconductor memory device having the above constitution operates as follows. That is, an input address from external is inputted to the address decoder 11 and the coincidence circuit 15. Then, the address decoder 11 decodes the input address to select word lines and bit lines of the memory cell array 12. Then, data is read from memory cells associated with the selected word lines and bit lines by the memory cell array 12, and outputted to one input terminal of the multiplexer 14 and the false data conversion circuit 13. Then, the false data conversion circuit 13 converts the read data into the false data, and outputs the false data to the other input terminal of the multiplexer 14.

Meanwhile, the coincidence circuit 15 compares the specific address set and outputted by the specific address setting circuit 16 with the input address, where if both addresses coincide with each other, the coincidence circuit 15 outputs a coincidence signal. Then, each time the coincidence signal from the coincidence circuit 15 is inputted, the counter circuit 17 updates the value of its internal count value, where the counter circuit 17 outputs a pulse signal of a specified time duration periodically once each time the internal count value becomes a preset specified value. Then, the output of the multiplexer 14 is toggled to the false data side for the specified time by the multiplexer switching circuit 18 according to the pulse signal derived from the counter circuit 17. That is, the coincidence circuit 15 and the counter circuit 17 constitute a coincidence-number counter.

As a result, each time the input address becomes the specific address a specified number of times, the multiplexer 14 selects false data from the false data conversion circuit 13 corresponding to a specified range of input addresses and transmits the data to the output buffer circuit 19. Otherwise, the multiplexer 14 selects read data derived from the memory cell array 12 and transmits the data to the output buffer circuit 19. Then, the data transmitted from the multiplexer 14 is outputted to external by the output buffer circuit 19.

In this case, when addresses of the memory cell array 12 are scanned in an unauthorized user's attempt at an illegal read, the false data corresponding to the specified range of input addresses is outputted each time the specific address is accessed to the specified number of times. Therefore, it becomes quite difficult to reproduce correct data or correct program codes from the acquired data. Thus, it is impossible for the unauthorized user to correctly emulate, based on the acquired data, a memory device capable of outputting the same data as data acquired by an authorized user from the memory cell array 12.

Also, even if the specific address should be found out from the acquired data, it would be impossible to determine which data is correct data, because the output data corresponding to the specified range of addresses following the specific address is in some cases correct data and in other cases false data.

In contrast to this, the authorized user is allowed to make such a setting for preparation of programs to be stored into the memory cell array 12 that data will not be read from the specific address. Also, because the authorized user knows the specific address and the false data conversion method, the authorized user can restore correct data from false data read from the specific address. Further, because the authorized user also knows the cycle period at which the false data is outputted as well as the range of the false data, only writing unnecessary data into the region corresponding to the specified range of addresses following the specific address makes it unnecessary for the authorized user to generate correct data by inversely converting the false data outputted based on the unnecessary data.

As described above, in this embodiment, there is provided a counter circuit 17 which outputs a pulse signal each time the coincidence signal from the coincidence circuit 15 is inputted to a specified number of times. Then, according to the pulse signal from the counter circuit 17, the multiplexer switching circuit 18 toggles the output of the multiplexer 14 from the read data side of the memory cell array 12 to the false data side connecting to the false data conversion circuit 13 over a specified range of addresses.

Therefore, when addresses of the memory cell array 12 are scanned in an unauthorized user's attempt at an illegal read, data in which false data are mixed in the read data at a specified period are outputted, so that correct data or correct program codes cannot be reproduced from the acquired data. As a result, it is also impossible to correctly emulate a semiconductor memory device capable of outputting the correct data or correct program codes. Also, even if the specific address should be found out from the acquired data, it would be impossible to decide which is correct data.

Further, in this embodiment, false data other than data read from the memory cell array 12 is outputted each time the specific address is accessed to the specified number of times. Therefore, by an arrangement that first program codes for use in an external arithmetic unit are stored into the memory cell array 12 and that the false data conversion circuit 13 converts the read data into second program codes for use in the arithmetic unit, it becomes possible to execute the second program codes each time the specific address is accessed to the specified number of times.

Second Embodiment

Figure 2:
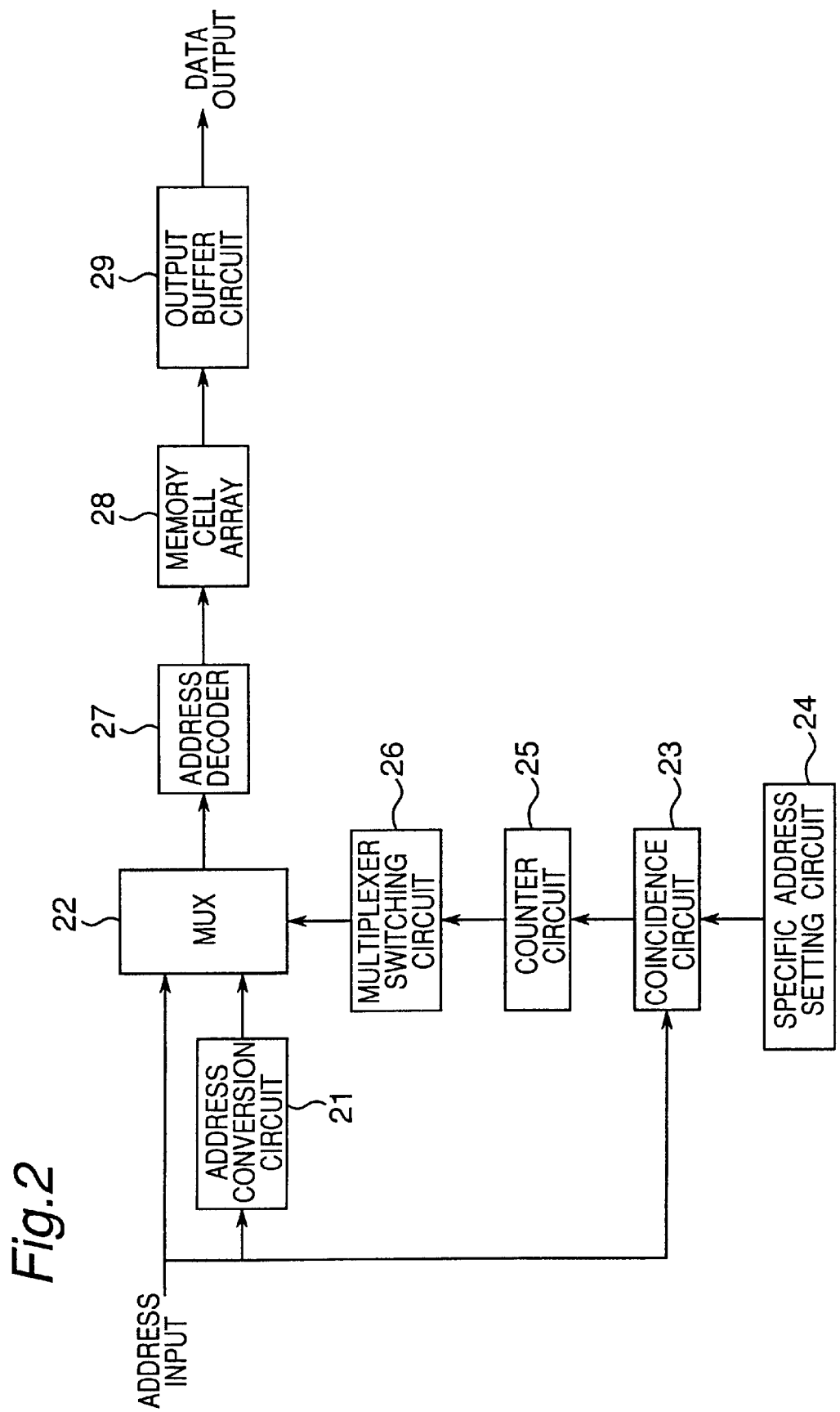
FIG. 2 is a block diagram of a semiconductor memory device other than FIG. 1.

FIG. 2 is a block diagram of a semiconductor memory device of this embodiment. This semiconductor memory device is generally made up of an address conversion circuit 21, a multiplexer (MUX) 22, a coincidence circuit 23, a specific address setting circuit 24, a counter circuit 25, a multiplexer switching circuit 26, an address decoder 27, a memory cell array 28 and an output buffer circuit 29.

In this case, the coincidence circuit 23, the specific address setting circuit 24, the counter circuit 25, the multiplexer switching circuit 26, the address decoder 27, the memory cell array 28 and the output buffer circuit 29 operate in the same manner as the coincidence circuit 15, the specific address setting circuit 16, the counter circuit 17, the multiplexer switching circuit 18, the address decoder 11, the memory cell array 12 and the output buffer circuit 19, respectively, in the first embodiment as shown in FIG. 1.

The semiconductor memory device having the above constitution operates as follows. That is, an input address from external is inputted to one input terminal of the multiplexer 22, the address conversion circuit 21 and the coincidence circuit 23. Then, the address conversion circuit 21 converts the input address into a new address other than the input address and outputs the address to the other input terminal of the multiplexer 22.

Meanwhile, the coincidence circuit 23 compares the specific address set and outputted by the specific address setting circuit 24 with the input address, where if both addresses coincide with each other, the coincidence circuit 23 outputs a coincidence signal. Then, each time the coincidence signal from the coincidence circuit 23 is inputted, the counter circuit 25 updates the value of its internal count value, where the counter circuit 25 outputs a pulse signal of a specified time duration periodically once each time the internal count value becomes a preset specified value. Then, the output of the multiplexer 22 is toggled to the converted address side for the specified time by the multiplexer switching circuit 26 according to the pulse signal derived from the counter circuit 25. That is, the coincidence circuit 23 and the counter circuit 25 constitute a coincidence-number counter.

As a result, each time the input address becomes the specific address a specified number of times, the multiplexer 22 selects the converted address over a specified range of input addresses and transmits the address to the address decoder 27. Otherwise, the multiplexer 22 selects the input address and transmits the address to the address decoder 27. Then, the address decoder 27 decodes the address derived from the multiplexer 22 to select word lines and bit lines of the memory cell array 28. Then, data is read from memory cells associated with the selected word lines and bit lines by the memory cell array 28, and outputted to the output buffer 29. Then, the read data is outputted to external by the output buffer circuit 29.

In this case, when addresses of the memory cell array 28 are scanned in an unauthorized user's attempt at an illegal read, false data read from the converted address other than the input address over a range corresponding to the specified range of input addresses is outputted each time the specific address is inputted to the specified number of times. Therefore, it becomes quite difficult to reproduce correct data or correct program codes from the acquired data. Thus, it is also impossible for the unauthorized user to correctly emulate, based on the acquired data, a memory device capable of outputting the same data as data acquired by an authorized user from the memory cell array 28.

Also, even if the specific address should be found out from the acquired data, it would be impossible to determine which data is correct data because the output data corresponding to the specified range of addresses following the specific address can be either correct data or false data.

As described above, in this embodiment, there is provided a counter circuit 25 which outputs a pulse signal each time the coincidence signal from the coincidence circuit 23 is inputted to a specified number of times. Then, according to the pulse signal from the counter circuit 25, the multiplexer switching circuit 26 toggles the output of the multiplexer 22 from the input address side to the converted address side connecting to the address conversion circuit 21 over a specified range of addresses.

Therefore, when addresses of the memory cell array 28 are scanned in an unauthorized user's attempt at an illegal read, data in which false data are mixed in the read data at a specified period are outputted, so that correct data or correct program codes cannot be reproduced from the acquired data. As a result, it is also impossible to correctly emulate a semiconductor memory device capable of outputting the correct data or correct program codes. Also, even if the specific address should be found out from the acquired data, it would be impossible to decide which is correct data.

Further, also in this embodiment, as in the first embodiment, by an arrangement that first program codes for use in an external arithmetic unit are stored into a region corresponding to the input address in the memory cell array 28 while second codes for use in the arithmetic unit are stored into a region corresponding to the converted address, it becomes possible to make the arithmetic unit execute the first program codes normally and to make the arithmetic unit execute the second program codes each time the specific address is accessed to the specified number of times.

Whereas the memory cell array 12, 28 is implemented by a flash EEPROM in the above individual embodiments, the memory cell array 12, 28 may also be implemented by other semiconductor memories such as nonvolatile memory or ROM. Further, the memory cell array 12, 28 is not limited to semiconductor memory.

Furthermore, the present invention is not limited to the constitution shown in FIGS. 1 and 2. It is also possible that, for example, the specific address is stored into internal memory of the coincidence circuit 15, 23 while the specific address setting circuit 16, 24 is omitted. In short, the constitution has only to be capable of outputting data other than data read from an accessed address in the memory cell array 12, 28 at a specified period based on the number of times the accessed address to the memory cell array 12, 28 coincides with the specific address.

The invention being thus described, it will be obvious that the same may be varied in many ways. Such variations are not to be regarded as a departure from the spirit and scope of the invention, and all such modifications as would be obvious to one skilled in the art are intended to be included within the scope of the following claims.

What is claimed is:

1. A memory device for detecting that an access address to a memory cell array has coincided with a preset specific address, counting a number of times of the coincidence between the access address and the specific address, and outputting controllable data, other than data read from the access address in the memory cell array, at a specified period synchronized with a cycle of reading data from the memory cell array based on a counted value.

2. A memory device as claimed in claim 1, comprising:
   a memory cell array;
   a data conversion circuit for converting read data read from the memory cell array into other data and outputting the converted data;
   a multiplexer for receiving, as its inputs, the read data and the converted data of the read data, and outputting either one of those data;
   a coincidence-number counter for counting a number of times the preset specific address and the input address have coincided with each other, and outputting a pulse signal each time a counted value becomes a specified value; and
   a multiplexer switching circuit for toggling the output of the multiplexer to the converted data side each time the pulse signal is inputted.

3. A memory device as claimed in claim 1, comprising:
   a memory cell array;
   an address conversion circuit for converting an input address into another address;
   a multiplexer for receiving, as its inputs, the input address and the converted address of the input address, and outputting either one of those addresses;
   an address decoder for decoding the address from the multiplexer to select memory cells of the memory cell array;
   a coincidence-number counter for counting a number of times the preset specific address and the input address have coincided with each other, and outputting a pulse signal each time a counted value becomes a specified value; and
   a multiplexer switching circuit for toggling the output of the multiplexer to the converted data side each time the pulse signal is inputted.

4. A memory device as claimed in claim 1, wherein
   first program codes executable by an external arithmetic unit are stored in the memory cell array, and
   the data, other than the read data, to be outputted at the specified period are second program codes executable by the arithmetic unit.

5. A memory device as claimed in claim 2, wherein
   first program codes executable by an external arithmetic unit are stored in the memory cell array, and
   the data conversion circuit converts the read data into second program codes executable by the arithmetic unit.

6. A memory device as claimed in claim 3, wherein
   first program codes executable by an external arithmetic unit are stored in a region accessed according to the input address in the memory cell array; and second codes executable by the arithmetic unit are stored in a region accessed according to the converted address in the memory cell array.

7. A memory device as claimed in claim 1, wherein the memory cell array is a semiconductor memory cell array, which is implemented by any one of nonvolatile memory, read only memory or batch-erase type electrically erasable, programmable read only memory.

8. A method of protecting data stored in a memory device comprising:

detecting when an access address to the memory device coincides with a designated address;

counting a number of times of coincidence between the access address and the designated address; and outputting controllable data, other than data stored in correspondence with the access address in the memory device, at a designated period synchronized with a cycle of reading data from the memory device based on a counted value, to thereby protect the data stored in correspondence with the access address.

9. The method of claim 8, wherein first program codes executable by an external arithmetic unit are stored in the memory device and the controllable data include second program codes executable by the arithmetic unit.

10. A memory apparatus, comprising:

a memory cell array;

a data conversion circuit for converting data read from the memory cell array into converted data and outputting the converted data;

a multiplexer for receiving read data and converted data and for outputting one of the read and converted data;

a coincidence-number counter for counting a number of times a designated address and an input address coincide with each other, and for outputting a signal each time a counted value equals a designated value; and a multiplexer switching circuit for toggling the output of the multiplexer to output the converted data each time the pulse signal is received, wherein output of the converted data is synchronized with a cycle of reading data from the memory array.

11. A memory apparatus as claimed in claim 10, wherein first program codes executable by an external arithmetic unit are stored in the memory cell array, and the converted data, other than the read data, to be outputted at a designated period synchronized with a cycle of reading data from the memory cell array, are second program codes executable by the arithmetic unit.

12. A memory apparatus as claimed in claim 10, wherein first program codes executable by an external arithmetic unit are stored in the memory cell array, and the data conversion circuit converts the read data into second program codes executable by the arithmetic unit.

13. A memory device as claimed in claim 10, wherein the memory cell array is a semiconductor memory cell array, which is implemented by any one of nonvolatile memory, read only memory and batch-erase type electrically erasable, programmable read only memory.

14. A memory apparatus, comprising:

a memory cell array;

an address conversion circuit for converting an input address into another address;

a multiplexer for receiving an input address and a converted address of the input address, and for outputting one of the input and converted addresses;

an address decoder for decoding the address from the multiplexer to select memory cells of the memory cell array;

a coincidence-number counter for counting a number of times a designated address and the input address coincide with each other, and for outputting a signal each time a counted value equals a designated value; and a multiplexer switching circuit for toggling the output of the multiplexer to output the converted address each time the pulse signal is received, wherein output of the converted address is synchronized with a cycle of reading data from the memory cell array.

15. A memory device as claimed in claim 4, wherein first program codes executable by an external arithmetic unit are stored in a region accessed according to the input address in the memory cell array; and second codes executable by the arithmetic unit are stored in a region accessed according to the converted address in the memory cell array.

16. A memory device as claimed in claim 11, wherein the memory cell array is a semiconductor memory cell array, which is implemented by any one of nonvolatile memory, read only memory and batch-erase type electrically erasable, programmable read only memory.

* * * * *